United States Patent
Donath et al.

(10) Patent No.: US 6,314,547 B1
(45) Date of Patent: Nov. 6, 2001

(54) METHOD FOR IMPROVING THE ASSIGNMENT OF CIRCUIT LOCATIONS DURING FABRICATION

(75) Inventors: Wilm E. Donath, New York; Prabhakar N. Kudva, White Plains, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/152,013

(22) Filed: Sep. 11, 1998

(51) Int. Cl.[7] .................................................. G06F 19/00
(52) U.S. Cl. ........................ 716/8; 700/108; 700/109; 700/110; 700/112; 700/117; 700/121; 438/5; 438/10; 438/11; 438/12; 438/464; 716/2; 716/7
(58) Field of Search ............................. 700/99, 108, 109, 700/110, 111, 112, 113, 114, 115, 116, 117, 121, 213, 214, 222, 223, 228–230; 438/5, 10, 11, 12, 460–464; 716/2, 7, 8

(56) References Cited

U.S. PATENT DOCUMENTS

| | | | |
|---|---|---|---|
| 5,105,362 | * | 4/1992 | Kotani .................................. 700/121 |
| 5,208,765 | * | 5/1993 | Turnbull ................................. 700/97 |
| 5,241,465 | * | 8/1993 | Oba et al. ............................. 700/100 |
| 5,499,192 | * | 3/1996 | Knapp et al. ............................. 716/7 |
| 5,654,903 | * | 8/1997 | Reitman et al. ...................... 700/121 |
| 5,778,386 | * | 7/1998 | Lin et al. ............................... 700/99 |
| 5,841,660 | * | 11/1998 | Robinson et al. .................... 700/100 |
| 5,844,802 | * | 12/1998 | Lepper et al. ........................ 700/100 |
| 5,856,923 | * | 1/1999 | Jones et al. .......................... 700/100 |
| 5,940,300 | * | 8/1999 | Ozaki ................................... 700/115 |
| 5,974,245 | * | 10/1999 | Li et al. ................................... 716/7 |
| 6,014,506 | * | 1/2000 | Hossain et al. .......................... 716/8 |
| 6,032,531 | * | 3/2000 | Roszhart et al. .................. 73/504.04 |

* cited by examiner

Primary Examiner—William Grant
Assistant Examiner—Ramesh Patel
(74) Attorney, Agent, or Firm—F. Chau & Associates, LLP

(57) ABSTRACT

The method for improving circuit location assignment is capable of operating in the boolean, electrical and spatial (location) domains. Optimization of location assignment parameters can be performed simultaneously by determining a subset of nets or paths and generating sets of motions to improve these nets or paths. Once sets of motions have been generated, they are tested to determine the most beneficial movement for improving the given circuit parameter (e.g., wireability, timing, etc.).

10 Claims, 6 Drawing Sheets

METHOD FOR IMPROVING THE ASSIGNMENT OF CIRCUIT LOCATIONS DURING FABRICATION

BACKGROUND OF THE INVENTION

1. Field of the Invention

The present invention relates to circuit fabrication. More particularly, it relates to a method for improving the location assignment of circuits during fabrication.

2. Prior Art

The process of assigning circuits to locations in, e.g., a chip, frequently includes a stage where all the circuits have been assigned locations, but the assignments are not optimal from either a wiring or timing perspective. For example, certain nets may be on the critical path, and as a result may have delays that are too large. A determination may then be made as to what sets of motions (i.e., assigning a subset of gates to different locations) decrease the sum of the capacitances of the nets on the critical path, with or without weights for the different nets.

Circuit synthesis has traditionally operated on optimized netlists. These optimizations have included both boolean and electrical optimizations. Placement algorithms, on the other hand, have focused primarily on the spatial domain, such as minimizing the total net length or a weighted average of net lengths. With the emergence of sub-micron technologies, there is a need for synthesis and placement algorithms to work seamlessly across all three domains, i.e., boolean, electrical and spatial.

Generally, physical designs have focused on spatial optimizations where the locations of netlist objects are selected with the goal of optimizing a given parameter, e.g., timing, wireability, etc. Recently, synthesis-like electrical optimizations have been implemented into placement subsystems. These electrical optimizations typically operate on the netlist and primarily use the spatial domain only to estimate wire capacitance/RC using a wire length estimator such as a Steiner estimator. Unfortunately, these optimizations do not make significant changes in the locations of the objects.

In view of the foregoing, there is also a need for placement synthesis algorithms to understand the location domain primarily from two main perspectives: 1) correct modeling of the spatial domain; and 2)optimization along the spatial domain. With respect to the correct modeling of the spatial domain, even if one were to focus on only the electrical and boolean domains, in order for the synthesis optimizations to be useful, they would have to model the interconnection correctly. This modeling requires the spatial information. Current techniques in synthesis for modeling interconnection which, for example, estimate wire capacitances as a function of fanouts, are inaccurate.

Examples of optimization along the spatial domain would be moving and rearranging the placement of circuits so as to improve the quality of the circuit for aspects such as timing and wireability. Synthesis has typically dealt with the two dimensions of boolean and electrical optimizations. Various combinations of algorithms are applied, each optimization creating possibilities for further boolean or electrical optimizations or a combination of both. Examples of boolean optimizations are factoring, redundancy removal, etc., while fanout correction/buffer insertion and sizing are examples of electrical optimizations. In later stages of synthesis (known as timing correction), mostly electrical optimization with some boolean optimizations are applied. With the increase in the capacitance/RC of interconnects with sub-micron technologies, synthesis must now consider the spatial domain, and therefore, optimizations now have to operate in all three domains.

As shown in FIG. 1, the synthesis and physical design are separate aspects of the fabrication. Thus, there is a need for an overall strategy of integrating the physical design and synthesis by creating a common framework in which electrical, boolean and location (spatial) optimizations can be performed simultaneously.

SUMMARY OF THE INVENTION

In one embodiment of the present invention, the placement of the individual cells of a circuit are manipulated to improve the overall timing of the circuit. The changes in such locations can be done in concert with resizing, buffer insertion, re-mapping and other such standard synthesis electrical and boolean transformations.

We consider the physical image in terms of an array of bins, each of which can hold a collection of gates. We assume that each gate has a known area and that for each bin, we know the available area. It is possible to have more sophisticated measures, such as wiring tracks available, so as to measure the wiring requirements. We consider Bin Circuit Count as the equivalent area required by the circuits and Bin Capacity as the equivalent area available for circuits.

The two criteria of interest in the present invention are wireability and timing. For coarse placement, wireability can either be directly estimated or one can use simpler measurements such as Bin Circuit Count vs. Bin Capacities, and Total Wire Length.

According to an embodiment of the invention, the method for improving circuit location assignment comprises the steps of determining the critical path of assigned circuit locations; generating a list of nets on the critical path; generating a list of motions for each net on the critical path; generating a set of motions for a complete path; testing each move to determining and improvement in slack for all gates participating in the move, and executing the move that provides the greatest improvement.

The selection of nets to be worked upon may use a different process than the one described here. In addition, the path that is given by the above process may be selected differently. This invention embodies all possible approaches, and is primarily concerned with the selection of motions after a net or a set of nets has been selected, and this is one example of a process by which the nets and path can be selected.

The applications envisioned for the present invention are improving a critical path, improving a critical section of the circuit (i.e., a DAG), improving wireability, resolving a bin overflow situation after moving circuits for timing, and resolvig.

During fabrication, the less often a complete timing analysis must be performed the better. The basic strategy is that when one works on improving wireability, they allows only nets with relatively large slack to increase in wire length and no critical or near-critical net is allowed to increase in wire length. When working on timing improvements, one may want to make sure that a significant improvement has been obtained. After this, the total picture may change so much that a complete timing analysis may need to be performed for further improvement.

Thus far, timing and timing improvements have been discussed. However, the present invention is applicable whenever there is a need for shortening selected nets. This can include, for example, placement for wireability, noise, or power.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF PREFERRED EMBODIMENTS

The question as to which movements would have the most beneficial effects on the timing behavior of the whole circuit relates specifically to the behavior of the critical path.

Figure 1:
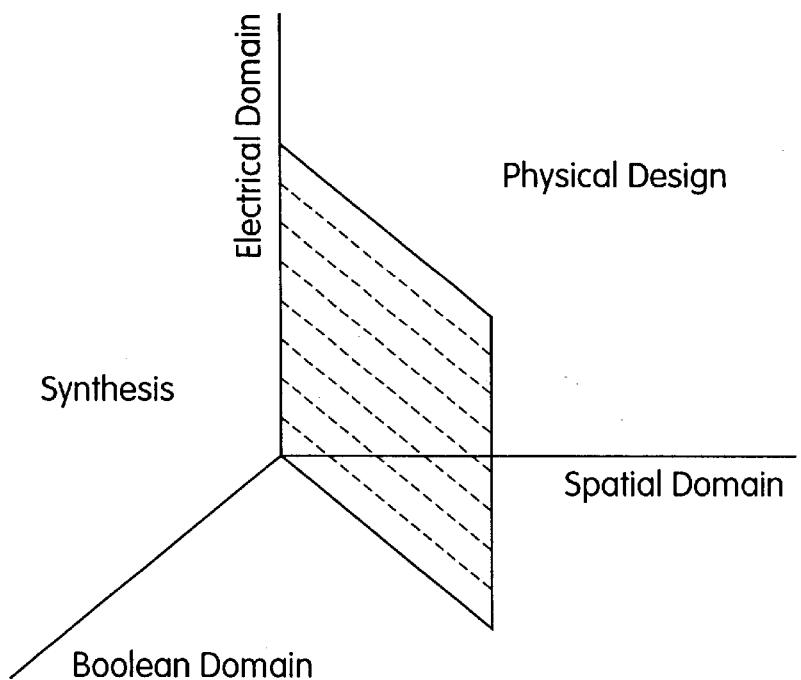
FIG. 1 is a graphical representation of optimization along various domains.
Figure 2:
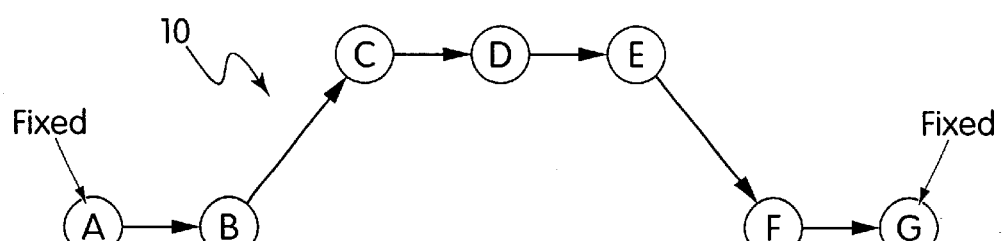
FIG. 2 is a graphical representation of the changes in locations for critical paths.

FIG. 2 shows an exemplary critical path 10 which will be used for purposes of describing the present invention. The questions presented for determining the most beneficial effects are: 1) What cells need to be moved to affect the capacitance of a net?; and 2) what cells need to be moved to affect the total capacitance of a set of nets? Consider the possibility of a meander in a critical path 10. Moving any individual circuit C, D or E would have no effect on the capacitance of the critical path, while the movement of a subsequence C, D and E of the driving cells in a critical path would achieve the desired result. A more complex problem arises when we consider that the circuits C, D or E have fanouts in a net.

Figure 3:
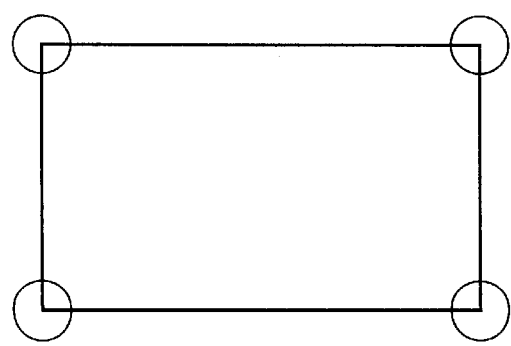
FIG. 3 is a graphical representation of the motion of individual circuits.

Similarly, FIG. 3 shows a single net 20, and with four nodes H1, H2, H3, and H4 connected to it. If any individual node is moved in the horizontal direction, there is no benefit (assuming orthogonal routing), however, if two adjacent nodes are moved together, the total net length can be decreased. The examples provided in FIGS. 2 and 3 illustrate the need for a formal definition of the valid motions of a node or a set of nodes that improve either the capacitance of a given net or the overall timing of the design.

Figure 4:
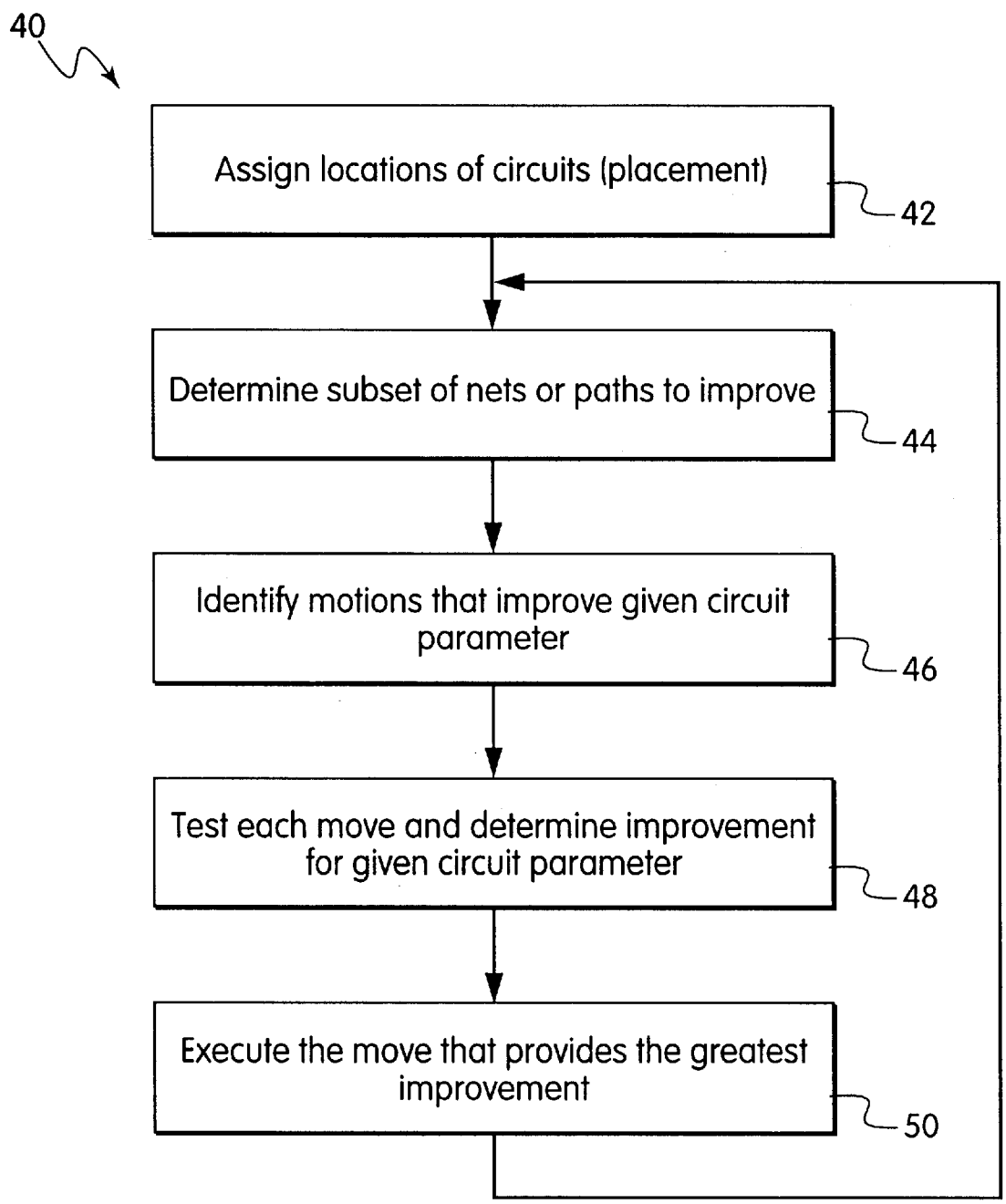
FIG. 4 is a flow diagram of the method for improving the overall assignment of circuit locations for any parameter according to an embodiment of the present invention.

FIG. 4 is a flow diagram 40 of the method for improving the overall assignment of circuit locations for any parameter according to an embodiment of the present invention. Initially, the locations of circuits is assigned 42 (i.e., placement). Once assigned, a determination is made as to what subset of nets or paths needs to be improved (step 44). The motions that improve the given circuit parameter are then identified (step 46). Each move is then tested to determine the extent of improvement for the given parameter (step 48). After testing, the move that provides the greatest improvement is executed (step 50). The entire process returns to step 44 to further improve the circuit placement.

Figure 5:
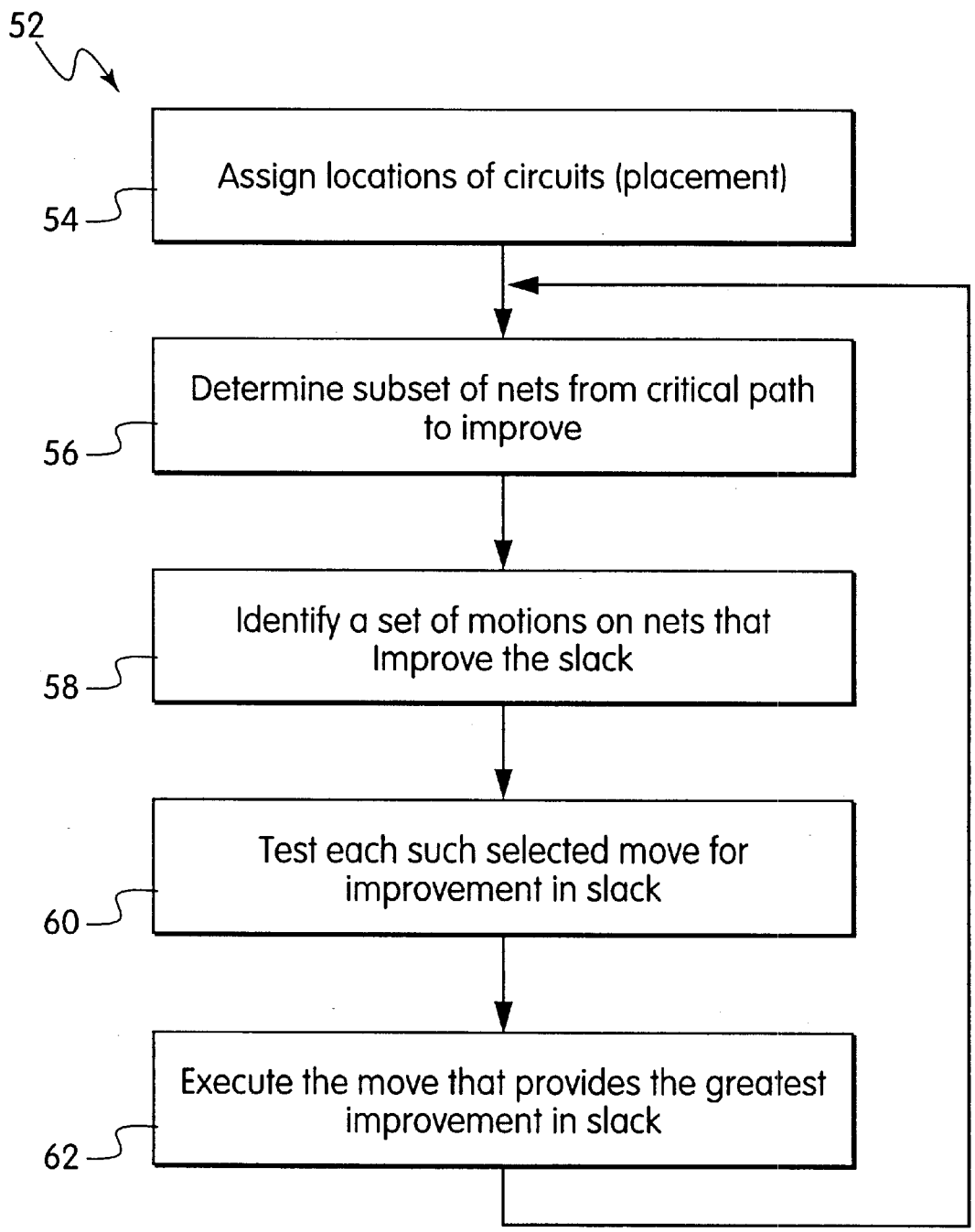
FIG. 5 is a flow diagram of the method for improving the timing in the assignment of circuit locations according to an embodiment of the invention.

FIG. 5 is a flow diagram of the method for improving the timing in the assignment of circuit locations according to an embodiment of the invention. As shown, the locations of the circuits (i.e., placement) is initially performed (step 54). Once assigned, a determination as to the subset of nets from the critical path too improve is made (step 56). The set of motions on the nets that improve the slack are identified (step 58), and each identified motion is tested for the improvement in slack (step 60). The move that provides the greatest improvement in slack is then executed (step 62).

Stability of Motions

In order to handle the aforementioned problems, the notion of stable motions has been developed. The following are definitions to aide in defining the present invention.

A net n consists of points $p_1, p_2, \ldots p_k$, where each point $P_i$ is at a location $x_i, y_i$. The configuration of a net can be given as a vector of size 2k as $C_n$. More specifically, $C_n$ can be written as $x_1, y_1, x_2, y_2, \ldots x_k, y_k$. The length L(n) of wire required to interconnect the configuration $C_n$ can be estimated or computed in several different ways. For purposes of this disclosure, Manhattan lengths will be used and other metrics ignored.

1. Often, for the sake of simplifying the computation, the length of wire is estimated to be that of the sum of the horizontal and vertical extent of the set of points. It is trivial to find cases for nets with 4 or more points where that length is inaccurate.

2. The minimal spanning tree length can be used (although it is a pessimistic measure in many cases)

3. The Steiner tree length is a commonly used measure. In this measure, one can generate intersection points where three or four wires connect, so that it gives the shortest length of wire required for interconnecting the set of points in a rectilinear system.

A fundamental theorem for constructing minimal length Steiner trees is:

Theorem 1 (Hanan): Consider the set of points that are needed to complete any rectangle formed by any pair of points $p_i$ and $p_j$ of the rectangle. For a Steiner tree to have minimal length, the intersection of points can be a subset of the original points of the net plus the rectangle-completing set of points.

Consider the direction vector of any point $p_i$ as $m_i$. The direction is represented as a binary vector of size 4, which indicates the motions in +x, −x, +y, −y, respectively. For example, the direction vector of node $p_i$, in direction +x is given by the direction vector <1000>. An example of $p_i$ can be any point A–E in FIG. 2 (i.e., $p_i$ refers to any circuit in the design).

Definition 1: The motion M in a graph is defined as a set S of T, where T is a tuple of the form $(p_i, m_i)$, where $p_i$ is the node and $m_i$ is its direction vector.

Definition 2: A primitive motion is one where just one node moves 1 step.

Definition 3: The derivative of L(n) is given as $$\frac{dL(n)}{dM} = \lim_{\substack{u>0 \\ u \to 0}} \frac{L(C+Mu) - L(C)}{u} \quad (1)$$

The notion of composition of two vectors $M_1$ and $M_2$.

Definition 4: Two motions $M_1$ and $M_2$ are composable if for any vector element either $M_1$ or $M_2$ has a value of 0. This means that no point p moves simultaneously in both sets.

Definition 5: A motion $M_c$ is a component of M if any vector element in $M_c$ has the same value as the corresponding vector element in M or is 0.

Definition 6: A motion $M_c$ is a proper component of M if it is a component of M and is not identical to M and has a non-zero vector element.

Definition 7: Two primitive motions $M_1$ and $M_2$, that start at the same x coordinate and go in the same +y direction (or -y direction) are called parallel motions; similarly, if they should start at the same y coordinate and both go in +x direction (or both in the -x direction) are also called parallel. A motion M is called parallel if all pairs of components are parallel. Finally, the concept of stability is defined:

Definition 8: A motion M is not stable if there exists a decomposition into two non-zero motions $M_1$ and $M_2$ such that $$M = M_1 + M_2$$

Corollary 1: If a motion is stable then for any decomposition such that $$\frac{dL(n)}{M} \geq \frac{dL(n)}{M_1} + \frac{dL(n)}{M_2}$$

$$M = M_1 + M_2$$

we find that $$\frac{dL(n)}{M} < \frac{dL(n)}{M_1} + \frac{dL(n)}{M_2}$$

The following is assumed to be true (it is readily proven for spanning rectangles—for Steiner trees and minimal spanning trees they are conjectures at this stage).

Conjecture 2: For the spanning rectangle, the minimal spanning tree, and Steiner tree, in the Manhattan metric, a motion M can be stable only if it is also a parallel motion.

Stability of Nets

The weighted sum of lengths of nets is now considered.

Definition 9: Consider a set S of nets $n_1, n_2, \ldots, n_m$. Assume there exists a weight vector corresponding to the net weight $w_1, w_2, \ldots, w_m$, where each $w_i$ is greater than 0. Let $$L(S) = \sum_{i=1}^{m} w_i L(n_i) \quad (2)$$

be the length of the set S.

We can find all nodes $p_1, p_2, \ldots, p_k$ which belong to at least one net in S, the configuration $C(S) = x_1, y_1, x_2, y_2, \ldots, x_k, y_k$ and motions just as for the case of a single net.

Lemma 1: For any motion M $$\frac{dL(S)}{dM} = \sum_{i=1}^{m} w_i \frac{dL(n_i)}{dM}$$

For the case of the weighted sum length of nets, we can also define stable sets of motions exactly as in definition 8. The properties embodied in corollary 1 hold for the function L(S). The conjecture 2 also extends to motions with sets of nets and the length L(S).

Conjecture 3: A motion M cannot be a stable motion for L(S) if it is not a parallel motion.

Another consideration for correctness is:

Theorem 4: A motion on a subset $p = (P_1 P_2 \ldots P_h)$ of the nodes of S cannot be a stable set for the weighted set of nets S, if there exists a partition of P into two sets $P_1$ and $P_2$ such that no net in S contains at least one node from $P_1$ and one node from $P_2$.

The proof of the theorem is straight forward: any motion in $P_1$ affects a different set of nets as compared to a motion in $P_2$: therefore, the derivatives for the two sets of motion must be additive.

Theorem 5: A motion M cannot be a stable motion for L(S) if every non-primitive component of M is not a stable motion for some net in S.

Strong Motions

The basic interest of algorithms in this field is to find moves which have large negative derivatives. As such, a stronger criterion than that for stability of motions is introduced.

Definition 10: A strong motion M is a stable motion which has the property that for all proper components $M_c$ of M $$\frac{dL(S)}{dM} < \frac{dL(S)}{dM_c} \quad (3)$$

Should motion M be primitive, it can be considered a strong motion.

In order to determine whether a motion M is strong, in the worst case one would test against all possible sub-components whether definition 10 holds. However, should a proper component $M_c$ of M be strong, then one need not test against any sub-component of $M_c$.

Conjecture 6: For a motion M to be strong, all primitive components of M must be parallel with each other.

Theorem 7: For a motion to be strong, P(M) cannot be divided into two subsets $P_1$ and $P_2$ such that no net has members in both $P_1$ and $P_2$.

According to theorem 4, the motion M cannot be stable. However, stability is a requirement for a strong motion.

We believe that the conjecture 4 extends also to strong motions.

Conjecture 7: A motion M cannot be a strong motion for L(S) if any pair of primitive motions composing M are not parallel.

Theorem 9: A motion M cannot be a strong motion for L(s) if every component of M is not a strong motion for some net in S.

Figure 6:
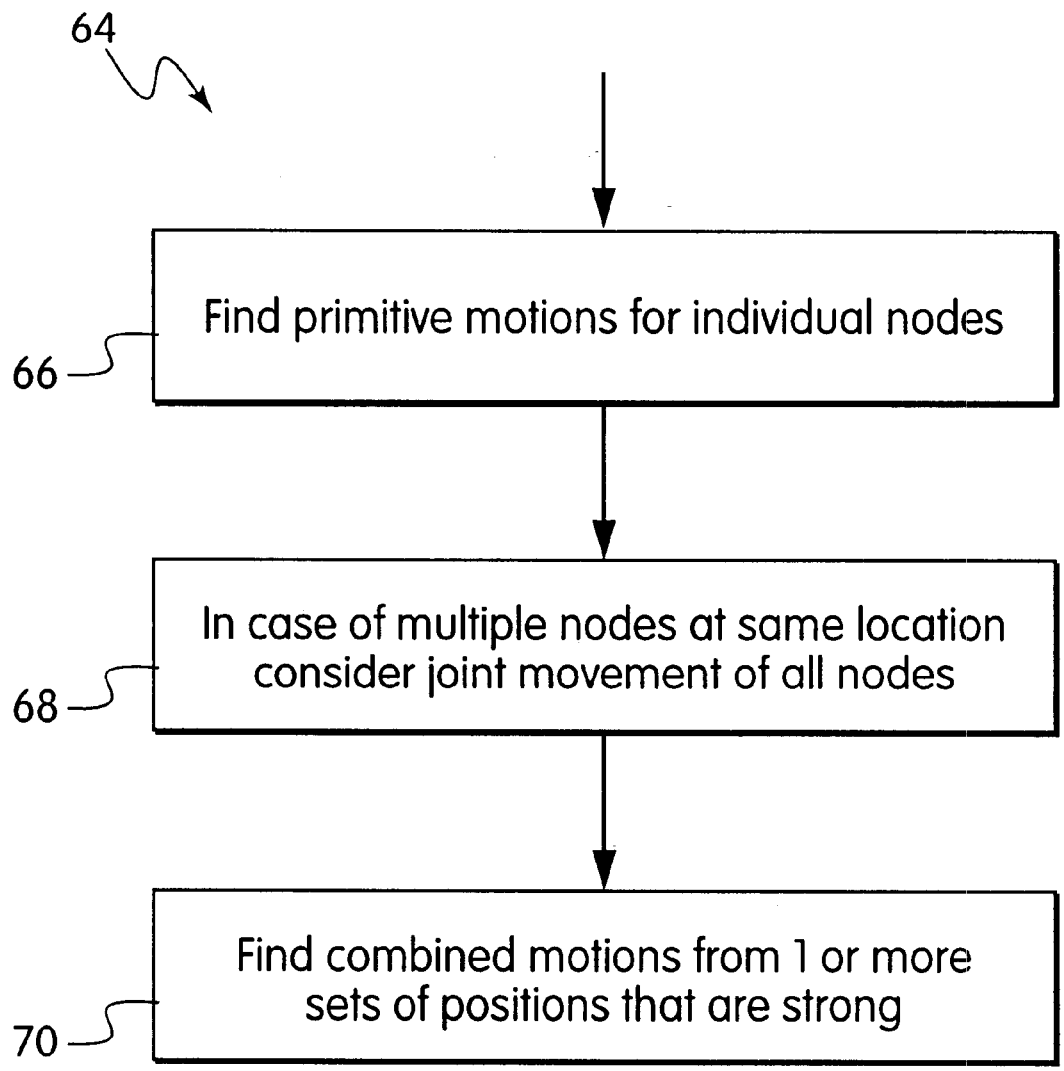
FIG. 6 is a flow diagram for creating strong motions according to an embodiment of the invention.

Creating Strong Motions for a Single Net Referring to FIG. 6, there are several sets of motions which constitute the complete set of strong motions for a single net:

1. The primitive motions of the individual nodes (see definition 2) are found for individual nodes (step 66).
2. Should more than 1 node be at the same coordinate, one would also test the joint movement of all the nodes at that coordinate (step 68).

3. The combined motions from 1 or more sets of positions that are strong are found (step 70), where the positions have either the same value of x or y and the motion is perpendicular to the alignment of the positions. Here, note that the only time such a motion can be strong is when a contiguous subset (or the complete set) of the positions along the alignment moves in lockstep.

Except for the first item (i.e., the primitive motions of the individual nodes) all other motions need testing whether their first derivative is less than any of its component motions.

Procedure for Creating Complex Moves for a Net

Complex Moves are those that involve the motion of more than one node. These include the moving of all nodes at the same location, that are called primitive. The main procedure is as follows:

1. The basic data structure is a list of nodes together with their location.
2. Sort the nodes horizontally, and then vertically.
3. If a sequence of nodes has the same x,y location, generate a joint move for these: use a procedure called GenerateBinMove.
4. Use a procedure called GenerateComplexMoves to generate the moves in the horizontal direction.
5. Sort the nodes vertically, and then horizontally.
6. Use a procedure called GenerateComplexMoves to generate the moves in the vertical direction.

The procedure GenerateComplexexMoves works on subsets of nodes that have the same x(or y) coordinate. These are further divided into bins at identical x,y coordinates. For each of the subsets at identical x(or y) coordinates, it finds the number of bins. A complex move consists of moving contents of two or more adjacent bins in the x (or y) direction. The number of such combinations, when m is the number of bins that can be simultaneously moved, is given as m(m−1)/2. Each such move can be indexed by its position pos(pos starts at 0) in the list of adjacent bins at the same x(or y) coordinate and the number l of bins simultaneously moved (where l is at least 2). The formula for such an index is given by $$index = pos + (l-2)m - (l-2)(l-2)/2$$

The nodes are, as stated previously, sequentially ordered, and can be addressed by the sequence number in that order. For each node we generate two pairs of indices: one pair states which nodes are the first and last node to have the same x(or y) coordinate, and which nodes are the first and last node to share the same bin. The procedure GenerateComplexMoves then works as follows:

1. Compute the four index structures—call the samebinfirst, samebinlast and alignedfirst, alignedlast—which are indexed with the nodes position in the sorted list and where 'samebinfirst' holds for any node the position of the first node in the same bin, 'samebinlast' holds for any node the position of the last node in the same bine, and similarly for 'alignedfirst' and 'alignedlast', except now it refers to the alignment of the nodes.
2. Set i to be the sequence number of the first book in the list—in C and C++, usually 0.
3. While i less than the number of books,
    If samebinlist(i)<alignedlast(i) then do:
        compute m=number of bins and create a table structure to hold entries for the m(m −1)/2 possible moves
        for j=0 to j=m−2, and dir=positive, negative, do:
            for l=2 to m−j−2, do:
        Compute the change in capacitance for moving the bins indexed by samebinfirst (i+j) to samebinlast (i+j+l1) and decide whether that move satisfied either the criterion for a stable or strong move: if so, label it as usable and insert it into the move list for this net—otherwise unusable. The function doing this checking is called TestSplit
            *endfor
        endfor
    Endif
4. Set i to 1+alignedlast(i).

Creating Motions for a Set of Nets

Figure 7:
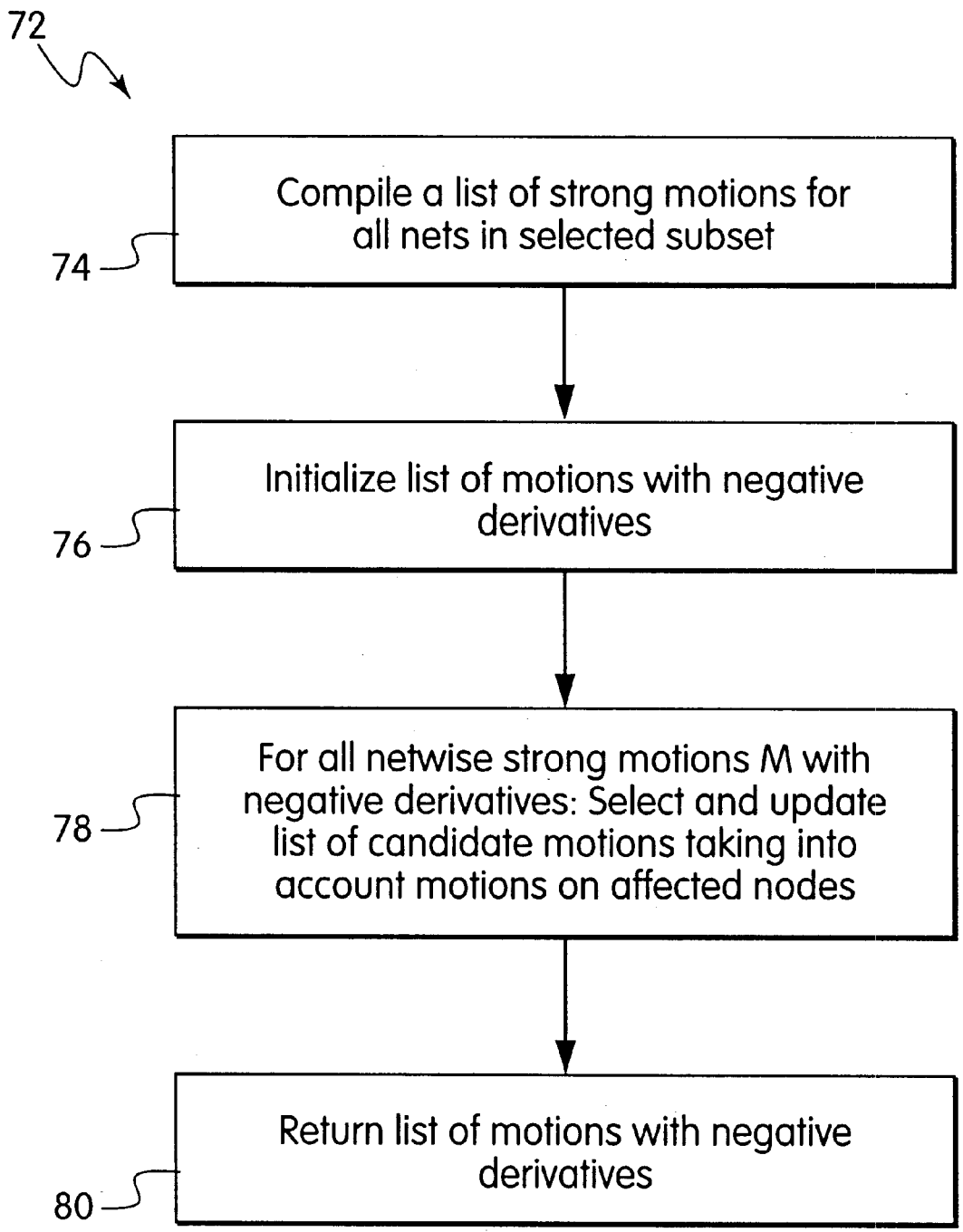
FIG. 7 is a flow diagram for generating strong motions for sets of nets according to an embodiment of the present invention.
Figure 8:
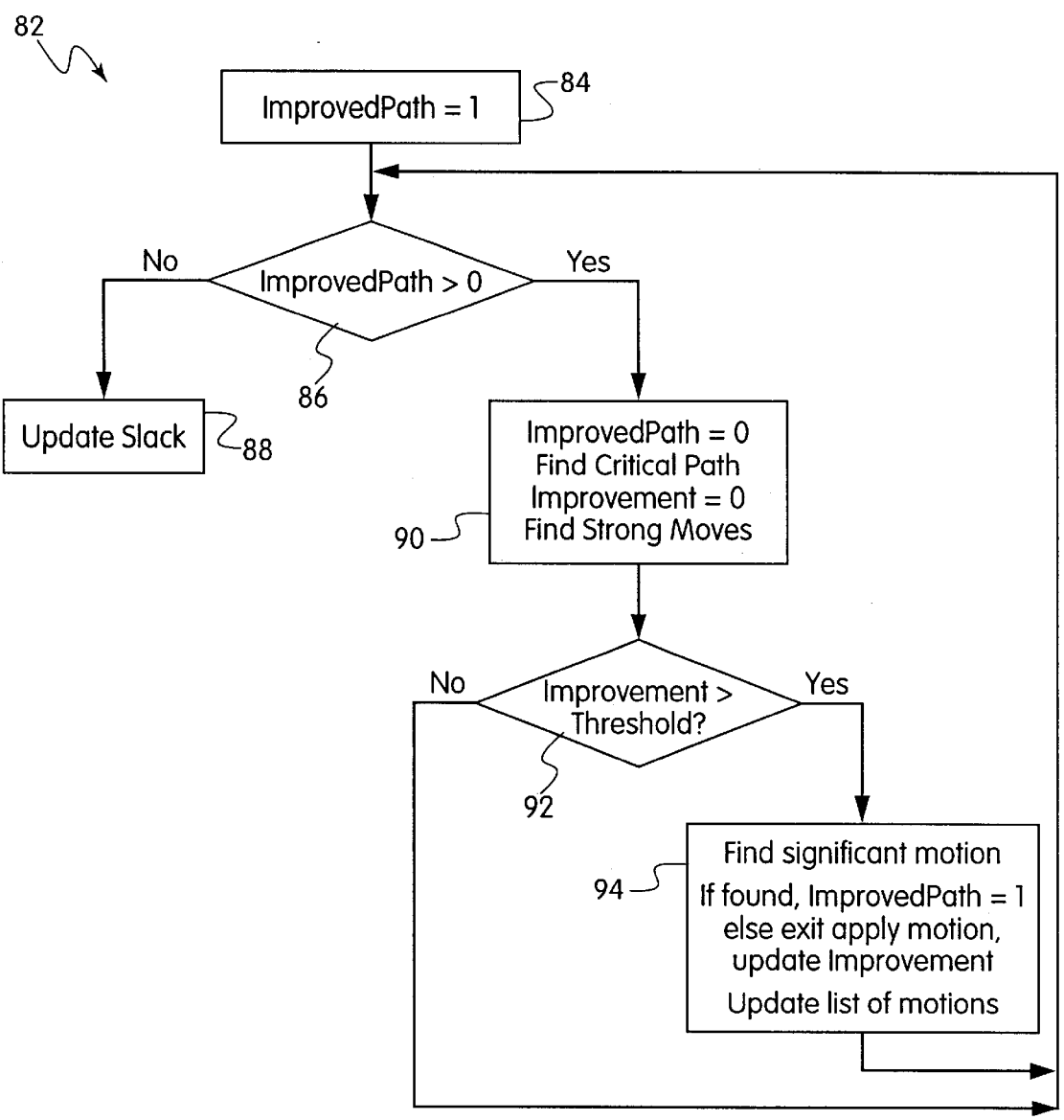
FIG. 8 is a flow diagram for improving the critical path according to an embodiment of the present invention.

The primary interest is finding motions that have a negative derivative for L(S). Thus, we are interested in finding the motions having a negative derivative for some L(n), where n is some net. For this algorithm, we use two results—Conjecture 8 and theorem 7. Referring to FIG. 7, 1. Compile a set or list of strong motions for all nets in a selected subset S (step 74).
2. Initialize a list of motions with negative derivatives in L(S) (e.g., $L_{neg}$) (step 76).
3. For all net-wise strong motions M, which also have negative derivatives in L(n) (step 8), do
    (a) Test if M has a negative derivative in L(S): if so, add it to $L_{neg}$.
    (b) Otherwise, open a list of candidate motions C(M), that initially holds only M
    (c) While C(M) is not empty, do
        i. Take a motion $M_c$ from C(M)
        ii. If $(dL(S)/dM_c)$ is negative enter it in $L_{neg}$.
        iii. Otherwise, consider $E(M_c)$, the set of nets that are connected to nodes in $P(M_c)$, the set of nodes that have motion in $M_c$.
        iv. For all $n \in E(M_c)$ where $(dL(n)/dM_c)$ is positive, do
            If there is a strong motion $M^n$ in n such that both $M^2 \cap$ and $M_c$ and $M^n - M_c$ are not empty, then enter $M^n \cap M_c$ as a candidate in C(M).

The list $L_{neg}$ is the end-product of this algorithm (step 80).

Improving a Critical Path

This algorithm is called with a threshold for the improvement required. It works as follows (using intermediate variables ImprovedPath and Improvement; 'Improvement' keeps track of the amount by which the path has been improved, while 'ImprovedPath' allows one to terminate the process should no improvement be possible):

Set ImprovedPath 1 (step 84)
While ImprovedPath>0 (step 86)
    Set ImprovedPath=0
    Find critical Path
    Set Improvement=0
    Find strong moves and any logical transformations that may improve the path (step 90)
    while Improvement<threshold (at step 92)
        find most significant motion that does not interfere with any other critical path (step 94)
        if none is found, exit
        apply motion and update Improvement
        Update list of motions
    Set ImprovedPath=1 (step 84)
    Report new value for slack
If the ImprovedPath is not greater than 0 (step 86) the slack is updated (step 88).

Path Selection for Pressure Points

The problem is that of improving not just the critical path, but reducing the number of nets that are in the critical region.

Thus, the concept of a critical pressure path is developed. That is, a path that, should it be improved, would improve many other paths. A path is selected by first defining a critical region: this includes all timing points whose slack are below some predetermined threshold. It also includes all timing segments that connect timing points of the critical region and whose delay alone would be sufficient to keep the source and the sink of the timing segment in the critical region. The number of distinct paths that emanate from it in the critical region and the number of distinct paths that enter it can be computed by recursive methods for each timing point. The number of paths that go through each timing point is the product of the number of paths entering and the number of paths emanating from it.

The starting point for selecting a critical pressure path is to start with a node with the largest value of the number of paths. One continues this path by going forward through the segments of the critical region and selecting recursively among the successors the one with the largest number of paths, and also going backward through segments again selecting recursively among the predecessors the one with the largest number of paths.

It should be understood that the present invention is not limited to the particular embodiment disclosed herein as the best mode contemplated for carrying out the present invention, but rather that the present invention is not limited to the specific embodiments described in this specification except as defined in the appended claims.

We claim:

1. A method for improving an assignment of circuit locations during fabrication design comprising the steps of:
   assigning locations of circuits;
   determining at least one of nets and paths in the circuits for improvement;
   providing a circuit parameter indicating a level of improvement;
   providing at least one motion having a level of improvement;
   identifying the at least one motion that improves the given circuit parameter;
   testing each identified motion; and
   executing a motion which has a negative derivative greater than a predetermined level to provide a highest level of improvement.

2. The method as claimed in claim 1, wherein the given circuit parameter in said step of identifying is one selected from a group consisting of timing and wireability.

3. The method as claimed in claim 1, wherein the determined at least one of nets and paths are from a critical path in at least one of the assigned circuits when the given circuit parameter for improvement is timing.

4. The method as claimed in claim 1, wherein said step of assigning further comprises the step of dividing a chip or macro into bins by horizontal and vertical lines.

5. A method for generating strong motions for a set of nets for improving an assignment of circuit locations during fabrication design comprising the steps of:
   providing a first list of motions with negative derivatives for selected nets;
   defining the first list of motions as a list of strong motions for the selected nets;
   providing a second list of motions with negative derivatives for all nets;
   selecting a third list of motions from the second list of motions which have negative derivatives greater than a predetermined level; and
   updating and replacing the list of strong motions by the third list of motions.

6. The method as claimed in claim 5, wherein said step of selecting and updating further comprises the step of taking into consideration the motions on affected nodes.

7. A method for improving critical paths for physical designs during fabrication design comprising the steps of:
   setting a first variable to one;
   finding a critical path when the first variable is determined to be greater than zero;
   setting a second variable to zero when the first variable is determined to be greater than zero;
   determining a list of motions with negative derivatives and transformations that improve the path;
   selecting a motion with a negative derivative greater than a predetermined level when the second variable is greater than a predetermined threshold; and
   applying the selected motion and updating the second variable and the list of motions.

8. The method as claimed in claim 7, further comprising the steps of:
   determining whether the first variable is greater than zero;
   setting the first variable equal to zero when it is determined to be greater than zero; and
   determining whether the second variable is greater than a predetermined threshold.

9. The method as claimed in claim 8, further comprising the step of returning to said step of determining whether the first variable is greater than zero after said step of applying and updating.

10. The method as claimed in claim 8, further comprising the step of updating slack when the it is determined that the first variable is not greater than zero.

* * * * *